United States Patent [19]
Purdom et al.

[11] Patent Number: 5,841,638
[45] Date of Patent: Nov. 24, 1998

[54] STACKED MEMORY FOR FLIGHT RECORDERS

[75] Inventors: Gregory W. Purdom, Sarasota; Endre M. Berecz, Bradenton, both of Fla.

[73] Assignee: L3 Communications

[21] Appl. No.: 602,066

[22] Filed: Feb. 15, 1996

[51] Int. Cl.$^6$ .............. H01R 9/09; H01R 4/58; H05K 7/14; B65D 81/02
[52] U.S. Cl. .............. 361/790; 361/803; 361/804; 439/69; 439/76.1; 439/91; 206/521; 206/305
[58] Field of Search .............. 361/790, 803, 361/804, 733, 735, 757, 758; 257/686; 439/69, 74, 76.1, 91; 206/521, 305

[56] References Cited

U.S. PATENT DOCUMENTS

| | | | |
|---|---|---|---|
| 3,904,934 | 9/1975 | Martin | 361/803 |
| 4,520,427 | 5/1985 | Brotherton et al. | 361/714 |
| 4,574,331 | 3/1986 | Smolley | 361/735 |
| 4,833,568 | 5/1989 | Berhold | 361/690 |
| 4,944,401 | 7/1990 | Groenewegen | 206/521 |
| 4,953,005 | 8/1990 | Carlson et al. | 257/666 |
| 5,053,967 | 10/1991 | Clavelloux et al. | 364/424.06 |
| 5,128,831 | 7/1992 | Fox, III et al. | 439/74 |
| 5,130,894 | 7/1992 | Miller | 361/803 |
| 5,160,320 | 11/1992 | Burkett, Jr. et al. | 439/69 |
| 5,251,099 | 10/1993 | Goss et al. | 361/721 |
| 5,407,505 | 4/1995 | Groenewegen et al. | 156/153 |
| 5,412,538 | 5/1995 | Kikinis et al. | 361/792 |
| 5,426,563 | 6/1995 | Moresco et al. | 361/790 |
| 5,499,164 | 3/1996 | Hill-Lindsay et al. | 361/785 |
| 5,536,177 | 7/1996 | Casey | 439/74 |

FOREIGN PATENT DOCUMENTS

| | | | |
|---|---|---|---|
| 0 427 106 A2 | 5/1991 | European Pat. Off. | H05K 7/14 |
| 59-205747 A | 11/1984 | Japan | 437/208 |
| WO 87/06091 | 10/1987 | WIPO | H05K 1/14 |
| WO 95/35589 | 12/1995 | WIPO | H01R 23/68 |

OTHER PUBLICATIONS

Electronic Materials and Processes Handbook, Harper & Sampson, eds.; Polyparaxylylene Coatings, p. 2.63 (by Brzpzpwski et al.), 1994.

Concise Encyclopedia of Polymer Science and Engineering, Kroschwitz, ed.; Xylylene Polymers, pp. 1325–1330 (by Beach et al.), 1990.

Concise Encyclopedia of Polymer Science and Engineering, Kroschwitz, ed; Polyurethanes, pp. 890–897 (by Backus et al.), 1990.

Whittington's Dictionary of Plastics, 2nd ed., by L. R. Whittington; Parylenes, p. 226, 1978.

*Primary Examiner*—Leo P. Picard
*Assistant Examiner*—John B. Vigushin
*Attorney, Agent, or Firm*—Joseph J. Kaliko

[57] ABSTRACT

A stacked memory module having alternating layers of printed circuit boards and spacers. Connections between a given circuit board surface and an adjacent (facing) stacked printed circuit board surface, are made using at least one conductive pad incorporated into the electrical circuitry printed on and within the perimeter of each of the adjacent pair of board surfaces; together with means for interconnecting these conductive pads. The spacers can, for example, take the form of standoffs, spacer boards provided with clearance cutouts for components on the printed circuit boards, etc. The printed circuit boards and spacers are then aligned and fastened together using, for example, one or more alignment rods. According to a preferred embodiment of the invention, the fastened assembly is placed in a hollow memory module housing (e.g., a metal cylinder) to complete the fabrication of the memory module. Other aspects of the invention are directed to flight recorders per se which incorporate the above described memory module; and to processes for fabricating both the above described memory module and flight recorders containing such memory modules.

3 Claims, 4 Drawing Sheets

```
┌─────────────────────────────────────────────────────────────┐
│ FORMING AT LEAST ONE CONDUCTIVE PAD IN ELECTRICAL           │
│ CIRCUITRY PRINTED ON AND WITHIN THE PERIMETER OF A          │
│ FIRST SURFACE OF A FIRST PRINTED CIRCUIT BOARD, WHEREIN     │
│ THE FIRST PRINTED CIRCUIT BOARD INCLUDES AT LEAST ONE       │
│ MEMORY DEVICE ON AT LEAST ONE SURFACE THEREOF               │
└─────────────────────────────────────────────────────────────┘
                              │           ╲ 301
                              ▼
┌─────────────────────────────────────────────────────────────┐
│ FORMING AT LEAST ONE CONDUCTIVE PAD IN ELECTRICAL           │
│ CIRCUITRY PRINTED ON AND WITHIN THE PERIMETER OF A          │
│ FIRST SURFACE OF A SECOND PRINTED CIRCUIT BOARD,            │
│ WHEREIN THE FIRST SURFACE OF THE FIRST PRINTED CIRCUIT      │
│ BOARD IS INTENDED FACE THE FIRST SURFACE OF THE SECOND      │
│ PRINTED CIRCUIT BOARD WHEN THE FIRST PRINTED CIRCUIT        │
│ BOARD AND THE SECOND PRINTED CIRCUIT BOARD ARE PLACED       │
│ TOGETHER IN A COMPONENT STACK                               │
└─────────────────────────────────────────────────────────────┘
                              │           ╲ 302
                              ▼
┌─────────────────────────────────────────────────────────────┐
│ STACKING THE FIRST PRINTED CIRCUIT BOARD AND THE SECOND     │
│ PRINTED CIRCUIT BOARD TOGETHER IN A COMPONENT STACK         │
│ THAT INCLUDES MEANS FOR SEPARATING AND SUPPORTING THE       │
│ FIRST PRINTED CIRCUIT BOARD AND THE SECOND PRINTED          │
│ CIRCUIT BOARD AND MEANS FOR INTERCONNECTING CONDUCTIVE      │
│ PADS LOCATED ON AND WITHIN THE PERIMETER THE FIRST          │
│ SURFACE OF THE FIRST PRINTED CIRCUIT BOARD AND THE          │
│ FIRST SURFACE OF THE SECOND PRINTED CIRCUIT BOARD           │
└─────────────────────────────────────────────────────────────┘
                              │           ╲ 303
                              ▼
┌─────────────────────────────────────────────────────────────┐
│ REGISTERING THE CONDUCTIVE PADS IN THE COMPONENT STACK      │
└─────────────────────────────────────────────────────────────┘
                              │           ╲ 304
                              ▼
┌─────────────────────────────────────────────────────────────┐
│ FASTENING THE COMPONENT STACK TOGETHER                      │
└─────────────────────────────────────────────────────────────┘
                                          ╲ 305
```

FIG. 3

STACKED MEMORY FOR FLIGHT RECORDERS

BACKGROUND OF THE INVENTION

1. Field of the Invention

The invention relates generally to aircraft flight recorders that employ solid state memory devices in memory means used to store flight data. More particularly, the invention relates to methods and apparatus for reducing the memory volume required for housing a solid state recording device so that the volume reduction can be advantageously used in other ways, such as to increase insulation thickness for improved fire protection, decrease crash housing size for weight reduction and improved crash protection, etc.

2. Description of the Related Art

Aircraft flight recorders, such as those installed aboard civilian and/or military aircraft, are commonly used to collect essential data of flights in progress and to record data of one or more flights for eventual read-out.

Such read-out may take place for an eventless flight. Unfortunately, it may also be necessary to read out recorded flight data in case of a possibly serious accident. The later eventuality requires that the flight recorder be able to meet adverse survival requirements designed to insure that the memory survives the possibility of extreme temperatures, pressures, shock, the effects of corrosion, etc., that the flight recorder may be exposed to as a result of an aircraft accident.

Problems related to the survivability of flight recorders have been addressed by the prior art. For example, flight recorders that used magnetic tape as a recording medium and further contained moving magnetic parts for writing data to such tapes, etc., have been replaced with solid state memory devices that eliminate moving parts and provide a more reliable means of preserving recorded data. Furthermore, prior art electronic device packages are known (for flight recorders and other devices as well) in which solid state memory cards are stacked to conserve space, to reduce package density with the object of reducing overall device package size, etc.

An example of one such device in the flight recorder context is described in U.S. Pat. No. 5,053,967, issued Oct. 1, 1991, to Clavelloux et al. In particular, the 5,053,967 patent, hereby incorporated by reference, describes a solid state memory device that uses EEPROM type memory chips on stacked memory cards to record flight data.

According to the incorporated reference, the EEPROM based memory circuits are sealed in metal cases. The metal cases are filled with an incompressible inert liquid to eliminate voids to make the packages pressure resistant. Circuit cards, on which circuits containing the sealed memory chips are included, are stacked and braced inside a housing, using glass micro balls to wedge the circuit cards therein.

The incorporated reference further teaches separating the stacked cards with spacers; stacking the memory cards so that they assume a parallelepiped shape in the memory housing; interconnecting the edges of the stacked cards using flexible circuits; and preferably protecting all input connections toward the memory means in parallel by using fast unidirectional zener diodes.

Further yet, the incorporated reference teaches using a silicon based anti-corrosion product, applied to both sides of the printed circuit board or cards so that the circuit cards are at least temporarily resistant to fire and deep sea immersion.

Although describing a flight recorder that includes solid state memory devices (the EEPROM chips) on stacked circuit boards, etc.; the teachings of the incorporated reference would make it difficult, if not impossible, to realize levels of memory module packaging density desirable (and in many cases required) for present day aircraft flight recorders.

Reasons why the teachings of the incorporated reference are inherently problematic include:

(1) The EEPROM type memory required by the incorporated reference is not dense enough to facilitate high density packaging; particularly when compared with the density of other present day commercially available non-volatile memory devices, such as flash memory chips, etc.

(2) The means used to facilitate the stacking of cards taught in the incorporated reference (card edge connectors) are themselves one of the most significant contributors to increased package size since, as those skilled in the art will readily appreciate, the connectors are typically the largest element on the circuit board. The problem is compounded as the number of connectors and/or number of interconnected stacked boards goes up (i.e., where a large number of connectors are used) and will itself have a direct negative impact on board size and overall package density. The problem is compounded even further by any requirement that all such connectors have to be located on the edge of each card, as taught by the incorporated reference.

Other inherent problems stemming from the teachings of the incorporated reference include: (a) the manufacturing process steps required to fill voids in the metal IC packages with the incompressible liquid; (b) the difficulty of insuring the stacked cards are properly wedged in the memory module housing particularly when, as taught in the incorporated reference, components are braced inside the housing using foreign objects, like glass micro balls, to wedge the circuit cards therein; (c) the problems that can arise from the wide temperature range over which the memory module must operate, particularly when the package contains a wide variety of internal materials such as glass (the micro balls), plastics, liquids, etc.; (d) the problems associated with insuring a uniform coat of the silicon based anti-corrosion product called for by the incorporated reference, the ability of silicon to perform well as an anti-corrosion product in the extreme temperature environments that the memory module may be exposed to, etc.; (e) the use of the extra components and manufacturing process steps suggested by the incorporated reference in order to protect all input connections toward the memory means in parallel (not necessary in many cases).

In view of the above, it would, for example, be desirable to provide a flight recorder that includes a memory module that contains printed circuit boards (where the term "printed circuit board" is defined herein to include unassembled printed circuit cards and printed circuit boards that are fully assembled, sometimes described more particularly as a "printed wiring assembly", with these terms all being used interchangeably herein), which allow interboard connectors to be located any place on the board (i.e., not just at the board edges; but anywhere else on and within the perimeter of the board) to help improve overall flight recorder memory module packaging density.

It would be further desirable to provide a flight recorder, flight recorder memory module and flight recorder memory module manufacturing process that solves the other problems discussed hereinabove.

Other patented examples of circuit packaging techniques in general, memory module packaging techniques, etc., that illustrate the present state of the art include: U.S. Pat. No. 5,412,538, issued May 2, 1995, to Kikinis et al.; U.S. Pat. No. 4,833,568, issued May 23, 1989, to Berhold; U.S. Pat. No. 4,574,331, issued Mar. 4, 1986, to Smolley; U.S. Pat. No. 5,251,099, issued Oct. 5, 1993, to Goss et al.; U.S. Pat. No. 4,953,005, issued Aug. 28, 1990, to Carlson et al.; U.S. Pat. No. 4,520,427, issued May 28, 1985, to Brotherton et al.; and Japanese Patent 59-205747, issued Nov. 21, 1984, to Kondou.

Multi-dimensional and multi-element electronic packaging techniques; as well as space saving memory module packaging techniques per se, are taught in the 538' patent to Kikinis et al. (directed to space saving memory modules); the 568' patent to Berhold (directed to three-dimensional circuit component assemblies and methods for constructing such assemblies); and the 331' patent to Smolley (directed to multi-element circuit construction).

Both the 568' and 331' patents, like the incorporated reference, require that the electrical connections between boards be on the board edges; again, this factor adversely affecting the potential for increasing package density for the reasons stated hereinbefore.

The 538' patent requires through hole connections that involve extra process steps during module fabrication (machining steps). Furthermore, as those skilled in the art will readily appreciate, package density is adversely affected by using through hole connectors as taught by the 538' reference.

Accordingly, it would be desirable, in addition to the other desired features of the invention discussed hereinabove, to be able to provide a flight recorder that does not require the use of through hole connectors or edge connections between printed circuit boards to thereby eliminate at least two of the difficulties in achieving increased package densities, reduced memory module sizes, etc.

The 099' patent to Goss et al., describes a high density electronics package that houses a plurality of circuit cards, heat sinks and circuit interconnections in a single conical shaped housing. The package includes stacked circuit boards.

According to the teachings of the 099' patent, connectors and connector pins on pairs of adjacent boards are interconnected through an opening in a heat sink disposed between the boards; and subassembled pairs of boards are interconnected directly to one to another (again using connectors and connector pins) without the use of an intervening heat sink, to form the card stack assembly located within the conical assembly. The card stack is locked in the housing using a multi-components locking mechanism (including tapered lock rings, screws and locks) to force the circuit boards, heat sinks and electrical connections contained within the housing, against the inner housing wall to secure the components placed therein.

Those skilled in the art will readily appreciate, using the teachings of the 099' patent as a point of reference, that it would be desirable to provide a high density package for a solid state flight recorder memory that does not require the use of heat sinks, conic surfaces, intricate locking mechanisms or require connector pins for making electrical connections between boards in the package.

Realizing this desire would eliminate such problems as having of having to drill holes in boards to affix the connectors and pins; reduce board to board spacing requirements necessitated by the size and bulk of such connectors and pins (which when used result in larger volume package requirements); and minimize the number of components required within the housing (for example, the aforementioned locks, tapered rings, screws, heat sinks, etc). It should be noted that in some applications it may be desirable to include heat sinks within the memory module package; however, the need for such devices within the memory module per se could be reduced and even eliminated entirely if memory module packaging size is reduced to the point where the memory module can be adequately protected from heat by insulation located outside the memory module per se (for example, insulation contained within the flight recorder; but located outside and surrounding the desired densely packed memory module included in the flight recorder).

The 005' patent to Carlson et al., describes a packaging system for stacking integrated circuits to provide short interconnection paths between such circuits.

According to the teachings of the 005' patent, integrated circuit dies are mounted to the interconnection leads on frames of tape automatic bonding (TAB) film. Thereafter, each frame of the TAB film with the attached integrated circuit die is affixed to an electrically insulating, thermally conductive plate to form a sandwich structure.

A number of sandwich structures are bonded together to form a stack of sandwiches (i.e., multiple layers of semiconductor devices and spacers assembled in a stack) which are secured together by the use of rods. The interconnection leads of each sandwich is made on a common outer surface with conductors. The multi-layer assembly, which could be cylindrically shaped or the shape of a square, etc., is then placed in a housing.

Those skilled in the art will readily appreciate that the packaging techniques taught in the 005' patent are not readily adaptable for use in the flight recorder context for several reasons. First, unit serviceability would be very difficult. To get to the surfaces of a given sandwiched structure, the bonded structures would need to be taken apart. Since the integrated circuit dies are mounted to the interconnection leads on frames of film; and the interconnection leads of each sandwich is then made on a common outer surface with conductors, if one layer suffers a failure it would be necessary to break all vertical conductors to disassemble and repair a layer, etc.

Accordingly, it would be desirable to provide a flight recorder and memory module therefore, that is easy to assemble, disassemble and service.

The 427' patent to Brotherton et al. teaches an electrical assembly that includes a stack of modules secured in a bore through a casing. All connections between boards (which are circular) are made on the periphery of the boards. The 427' patent goes on to teach that the component casing includes longitudinal grooves on the internal surface thereof for accommodating electrical interconnections between modules, insulating material, etc. The multiple modules are secured by using rods and then the whole assembly is placed in a cylindrical housing.

Although the 427' patent represents an improvement over the edge connection strategies discussed hereinbefore with reference to, for example, the incorporated reference (though the 427' patent is not directed to flight recorder memory modules per se); the 427' patent still requires that connections between boards be made on the periphery thereof. Accordingly, connector density maximization prospects are again limited when compared with a desirable strategy that would allow a connector to be located any place on the board.

Additionally, the machining steps required to manufacture the type of casing called for by the 427' patent (i.e., machining a casing that includes longitudinal grooves on its internal surface to accommodate electrical interconnections between modules, insulating material, etc.), are time consuming and costly.

It would be desirable to be able to produce high density flight recorder memory modules without having to perform such machining operations. Still further, the teachings of the 427' patent require the handling and manipulation of many loose pieces during the assembly process (for example, the conductive members depicted in FIG. 1 of the 427' patent, etc.), which for obvious reasons is not desirable.

Finally, the aforementioned Japanese Patent to Kondou (patent number 59-205747), discloses techniques for manufacturing a semiconductor device taking the form of multiple layer assemblies bonded together with a heat resisting resin. Alternate spacers and stacked substrates are used. Space formed by the spacers is filled with an insulating adhesive resin, such as epoxy; and the resin is cured. Interconnections between layers is made via edge connecting a set of exposed electrode terminals, exposed to the side surface of the device.

The packaging techniques taught in Japanese Patent 59-205747 to Kondou require bonding multiple assembly layers together which, as indicated hereinbefore, is problematic when trying to effect repairs on assembly components without destroying the assembly. The packaging process taught by Kondou also requires the application of heat as part of the manufacturing process.

In the flight recorder memory module context, where thermal expansion and pressure problems need to be anticipated and dealt with, bonding assemblies together and filling spaces between stacked circuits with an insulating adhesive resin (as taught by Kondou) would only compound the number of variables that need to be addressed in order to protect the module under adverse temperature and pressure conditions.

Still further, the teachings of Kondou (employed at the sub-chip level, working with dies; as opposed to dealing with the packaging of memory chips in a flight recorder memory module environment at the circuit board level), call for interconnections between layers to be made via edge connecting a set of exposed electrode terminals (exposed to the side surface of the device), which if applied at the circuit board level (for the reasons stated hereinbefore) would not lend itself to increasing connector density and overall package density.

Accordingly, it would be desirable to provide a flight recorder, flight recorder memory module and flight recorder memory module fabrication techniques that do not require the steps of bonding components or assemblies together; do not require the use of heat or filling spaces between stacked circuit cards with resins or any other material that needs to be cured, during the assembly process; or require using edge connections to interconnect layers of stacked circuitry.

In addition to all of the aforementioned desirable attributes of flight recorders, flight recorder memory modules and flight recorder memory module fabrication techniques, it would be desirable to reduce the memory volume required for a solid state flight recorder so that the volume saved could, as indicated hereinbefore, be used in other ways, such as to increase insulation thickness for improved fire protection; decrease crash housing size for weight reduction and improved crash protection, etc.

SUMMARY OF THE INVENTION

In view of the foregoing, it is a general object of the invention to reduce the memory volume required for memory modules in general and for memory modules used in solid state flight recorders in particular.

To help achieve this general object it is a more specific object of the invention to provide a memory module which may be used in a flight recorder (and other applications as well wherever reference is made to a flight recorder memory module per se) that includes stacked circuit boards which may be interconnected using connectors located any place on the board (i.e., not just at the board edges, periphery of the board when circular, etc.); to help improve overall memory module packaging density.

It is a further object of the invention to provide a flight recorder, flight recorder memory module and flight recorder memory module manufacturing process that does not use metal IC packages that need to be filled with an incompressible liquid to survive in high pressure environments; or require that stacked boards be braced or otherwise wedged in the memory module housing using foreign objects, like glass micro balls, to retain the circuit boards in the housing.

It is yet another object of the invention to provide a process for fabricating the desired memory module using an anti-corrosion product that is easy to uniformly apply to circuit boards and which performs well as an anti-corrosion product in the extreme temperature environments that the memory module may be exposed to.

Still another object of the invention is to provide a memory module for a flight recorder that does not require the use of through hole connectors to electrically interconnect stacked memory modules.

Yet another object of the invention is to provide a high density package for a solid state flight recorder memory that does not require the use of heat sinks, conic surfaces, intricate locking mechanisms or require connector pins for making electrical connections between boards in the package.

A still further object of the invention is to provide a flight recorder and memory module therefore, that is easy to assemble, disassemble and service.

Furthermore, it is an object of the invention to provide processes for fabricating flight recorders and memory modules therefor, which enable high density flight recorder memory modules to be produced without having to perform extensive machining operations on the circuit boards themselves for providing means for interconnecting boards arranged in a stacked configuration; and allow such recorders and modules to be produced without having to handle and manipulate many loose pieces during the assembly process.

Additionally, it is an object of the invention to provide a flight recorder, flight recorder memory module and flight recorder memory module fabrication techniques that do not require the steps of bonding components or assemblies together; do not require the use of heat or filling spaces between stacked circuit boards with resins or any other material that needs to be cured, during the assembly process; or require using edge connections to interconnect layers of stacked circuitry.

Yet another specific object of the invention is to reduce the memory volume required for a solid state flight recorder so that the volume saved could be used in other ways, such as to increase insulation thickness for improved fire protection; decrease crash housing size for weight reduction and improved crash protection, etc.

According to one aspect of the invention, a stacked memory module is described having alternating layers of printed circuit boards and spacers (in the form of standoffs or actual spacer boards). Circuits on the surfaces of a given printed circuit board are interconnected using through board holes (vias); however, connections between a given circuit board surface and an adjacent (facing) stacked printed circuit board surface, are made using (a) at least one conductive pad incorporated into the circuitry printed on and within the perimeter of each of the adjacent pair of board surfaces; and (b) means for interconnecting conductive pads located on and within the perimeter of an adjacent pair of board surfaces.

Furthermore, according to this one aspect of the invention, when the spacer takes the form of actual spacer boards, the boards are provided with clearance holes for the components on the printed circuit boards; and the printed circuit boards and spacers (of any type, board, standoff, etc.) are aligned and fastened together with rods.

According to a preferred embodiment of the invention, the assembly is placed in a hollow memory module housing (e.g., a metal cylinder). The memory module housing may then be further placed in a thermal insulator and a crash housing to facilitate use of the memory module in a flight recorder; although the invention is not limited to memory modules being used in the flight recorder context.

Other aspects of the invention are directed to flight recorders per se which incorporate the above described memory module; and to processes for fabricating both the above described memory module and flight recorders containing such memory modules.

More particularly, a first aspect of the invention is directed to a memory module for storing digital data, comprising: (a) a stacked plurality of printed circuit boards at least one of which has least one memory device on at least one board surface; (b) at least one conductive pad incorporated into electrical circuitry printed on and within the perimeter of each of an adjacent pair of board surfaces; (c) means for interconnecting conductive pads located on and within the perimeter of an adjacent pair of board surfaces; (d) spacer means for separating and supporting the stacked plurality of printed circuit boards; (e) alignment means for registering conductive pads located on adjacent pairs of printed circuit boards; and (f) means for fastening together the stacked plurality of printed circuit boards and the spacer means.

According to a preferred embodiment of the invention, flash memory devices are used in the memory module; although the invention is not limited as such (i.e., the invention contemplates use of other types of solid state memories as well as flash memories, such as EEPROM memory, etc.)

Furthermore, according to a preferred embodiment of the invention, the stacked plurality of printed circuit boards is circular; and the spacer means includes clearance cutouts large enough to accommodate the profile of any components mounted on a printed circuit board surface opposing the spacer means.

Exemplary alternate embodiments of the invention contemplate the spacer means as being boards; or envision the spacer means as being a set of standoffs that separate and support adjacent pairs of printed circuit boards. As boards, the spacer means could, for example, be made using the same material used to fabricate the printed circuit boards. As standoffs, the spacer means could, for example, be fabricated using a non-conductive plastic.

Still further, according to the first aspect of the invention, the alignment means referred to hereinabove comprises at least one alignment rod secured to and through the stacked plurality of printed boards and spacer means; and the memory module itself further comprises a memory module housing for protecting and storing the stacked plurality of printed boards and spacer means secured by the at least one alignment rod.

According to a preferred embodiment of the invention, the aforementioned means for interconnecting comprises an elastomer connector; the at least one conductive pad is metallic and formed to enable the means for interconnecting to be connected thereto; and the memory module further comprises means for coupling electrical signals between an external source and the at least one memory device.

In one embodiment of the invention, the means for coupling further comprises means for communicating electrical signals between the external source and the at least one memory device via a connector means to which the means for communicating is attached; and a locking mechanism for securing the means for communicating to the connector means.

Finally, the first aspect of the invention contemplates the existence of at least one via through a given printed circuit board through which to connect conductive pads located on opposite surfaces of the printed circuit board.

The memory module described hereinabove may be used to store flight data or digital data from any source.

A further aspect of the invention is directed to a flight recorder comprising: (a) a crash housing; (b) a memory module located within the crash housing, where the memory module takes the form of the memory module described hereinabove with reference to the first aspect of the invention; and (c) thermal insulation for protecting the memory module from heat.

According to a preferred embodiment of this further aspect of the invention, the crash housing is cylindrical and each of the stacked plurality of printed circuit boards is circular.

The invention is also, as indicated hereinabove, directed to processes for fabricating a memory module for storing digital information and to processes for fabricating a flight data recorder that includes a solid state memory.

One such process (for fabricating a memory module) comprises the steps of: (a) stacking a plurality of printed circuit boards at least one of which has least one memory device on at least one board surface; (b) forming at least one conductive pad in electrical circuitry printed on and within the perimeter of each of an adjacent pair of board surfaces; (c) interconnecting conductive pads located on and within the perimeter of an adjacent pair of board surfaces; (d) separating and supporting the stacked plurality of printed circuit boards utilizing spacer means; (e) registering conductive pads located on adjacent pairs of printed circuit boards; and (f) fastening together the stacked plurality of printed circuit boards as separated by the spacer means.

An alternative exemplary process, contemplated by the invention, for fabricating a densely packed solid state memory module, comprises the steps of: (a) forming at least one conductive pad in electrical circuitry printed on and within the perimeter of a first surface of a first printed circuit board, wherein the first printed circuit board includes at least one memory device on at least one surface thereof; (b) forming at least one conductive pad in electrical circuitry printed on and within the perimeter of a first surface of a second printed circuit board, wherein the first surface of the first printed circuit board is intended face the first surface of the second printed circuit board when the first printed circuit board and the second printed circuit board are placed together in a component stack; (c) stacking the first printed circuit board and the second printed circuit board together in a component stack that includes means for separating and supporting the first printed circuit board and the second printed circuit board and means for interconnecting conductive pads located on and within the perimeter the first surface of the first printed circuit board and the first surface of the second printed circuit board; (d) registering the conductive pads in the component stack; and (e) fastening together the components of the component stack.

According to preferred embodiments of the invention, the aforementioned processes further comprise the steps of coating each of the printed circuit boards with a uniform coating of an anti-corrosion product, such as PARYLENE (a polyparaxylylene coating from Union Carbide Company); securing at least one alignment rod to and through the stacked plurality of printed circuit boards separated by the spacer means; protecting and storing the stacked plurality of printed boards and spacer means (as secured by the at least one alignment rod) in a memory module housing; and forming at least one via through a given printed circuit board through which to connect conductive pads located on opposite surfaces of a given printed circuit board.

An exemplary process for fabricating a flight data recorder that includes a solid state memory module built in accordance with the principals of the invention, comprises the steps of: (a) fabricating a memory module using one of the processes contemplated by the invention as described herein; (b) installing the memory module in a crash housing contained within the flight recorder; and preferably (c) further protecting the memory module installed within the crash housing with a layer of insulation.

The invention features a densely packed memory module that may be used advantageously in a solid state flight recorder or any other device where packaging density considerations are important. Furthermore, the invention features a densely packed memory module that includes stacked circuit boards which may be interconnected using connectors located any place on the board (i.e., not just at the board edges, periphery of the board when circular, etc.); to help improve overall flight recorder memory module packaging density.

The aforementioned memory module does not use metal IC packages that need to be filled with an incompressible liquid to survive in high pressure environments; does not require that stacked boards be braced or otherwise wedged in the memory module housing using foreign objects, like glass micro balls, to retain the circuit boards in the housing; incorporates an anti-corrosion product that is easy to uniformly apply to circuit boards; does not require the use of through hole connectors to electrically interconnect stacked memory modules; does not require the use of heat sinks, conic surfaces, intricate locking mechanisms or require connector pins for making electrical connections between boards in the package; is easy to assemble, disassemble and service; does not require the performance of extensive machining operations on the circuit boards themselves for providing means for interconnecting boards arranged in a stacked configuration; does not require the handling and manipulation of many loose pieces during the assembly process; does not require the steps of bonding components or assemblies together, the use of heat, resins and space fillers during the assembly process; or require using edge connections to interconnect layers of stacked circuitry.

Finally, the invention features a solid state flight recorder that includes the aforementioned memory module and enough extra volume to increase insulation thickness for improved fire protection; decrease crash housing size for weight reduction and improved crash protection, etc.

These and other objects, embodiments and features of the present invention and the manner of obtaining them will become apparent to those skilled in the art, and the invention itself will be best understood by reference to the following Detailed Description read in conjunction with the accompanying Drawing.

BRIEF DESCRIPTION OF THE DRAWING

FIG. 3 depicts in the form of a flow diagram an exemplary process for fabricating a memory module of the type contemplated by the invention.

DETAILED DESCRIPTION

Figure 1:
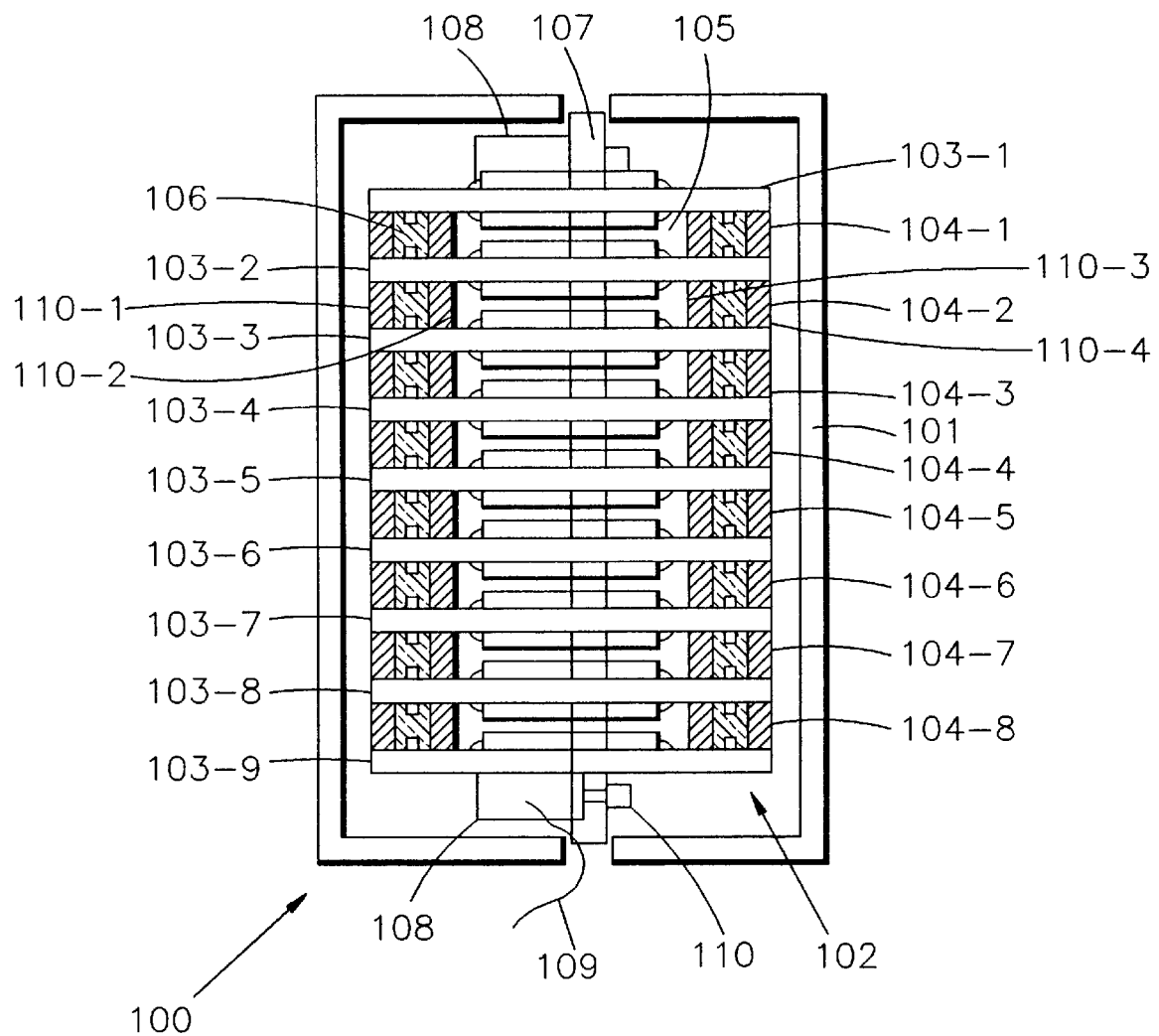
FIG. 1 depicts a cross sectional view of an exemplary memory module that may be used to illustrate the principals of the invention.

Reference should now be made to FIG. 1 which, as indicated hereinbefore, depicts a cross sectional view of exemplary memory module 100 which may be used to illustrate the principals of the invention.

More particularly, FIG. 1 depicts memory module 100 as including a protective memory module housing 101 containing component stack 102 (to be described in detail hereinafter). Memory module 100 may be used for storing digital data such as (but not limited to), flight data.

Exemplary memory module 100 shown in FIG. 1 is depicted as being cylindrically shaped (again, not a limiting factor as other shapes may be more desirable for a given application), with component stack 102 being made up of alternating layers of printed circuit boards and spacer means. The type of printed circuit boards and spacer means contemplated by the invention will be described in detail hereinafter.

In the illustrative component stack 102 of memory module 100 depicted in FIG. 1, nine printed circuit boards are shown in cross section at reference numerals 103-1 thru 103-9, respectively. Eight illustrative spacer means, in the form of spacer boards per se, are also depicted in FIG. 1. These spacer boards are shown in cross section at 104-1 thru 104-8, respectively; and could, for example, be made from the same materials used to fabricate the printed circuit boards (without components) themselves.

The illustrative spacer boards, like the one shown in cross section at 104-1, have holes or clearance cutouts provided for the components on the printed circuit boards (the term "cutout" as used herein is defined to encompass holes as well as boards shaped for component clearance purposes, etc.). One such cutout (in this case through spacer board 104-1) is shown at 105 in FIG. 1.

Furthermore, the illustrative spacer boards, again like the one shown in cross section at 104-1, have openings for interboard surface mount connectors (also referred to hereinafter as "means for interconnecting"). An example of one such connector, located in an opening through spacer board 104-1 (a hole in which the connector is inserted), is shown at 106 in FIG. 1.

According to a preferred embodiment of the invention, a commercially available connector, like the ampliflex connector from AMP, Inc. (an elastomer connector), may be used to interconnect conductive pads (a form of contact) which are formed on and within the perimeter of an adjacent pair of printed circuit board surfaces separated by and facing the spacer means.

An exemplary printed circuit board depicting how conductive pads may be located on the surface of boards used in memory module 100, will be set forth hereinafter with reference to FIG. 2.

Those skilled in the art will appreciate that the ability to in fact locate conductive pads anywhere on a printed circuit board surface; as opposed to just the edges thereof (i.e., the ability to incorporate at least one conductive pad into electrical circuitry printed on and within the perimeter of each of an adjacent pair of board surfaces), is a key factor that gives rise to the ability to increase package density and help achieve many other of the objectives of the invention as set forth hereinabove.

Additionally, by using the preferred means for interconnecting (a connector like the aforementioned ampiflex device), no hardwiring or soldering of the connector to the conductive pads need be performed (i.e., the connections can be made between the connectors and conductive pads easily via surface mount connections that the form and shape of the conductive pads can be made to accommodate). As a result, further economies and the realization of still further objects of the invention (like avoiding the use of heat in the assembly process when possible, providing a memory module that is easy to assemble, etc.), can be realized.

It should be noted, as indicated hereinbefore, that the spacer means contemplated by the invention is not limited to spacer boards per se. Any means that serve the purpose of separating and supporting printed circuit boards, providing the necessary clearance for components on the printed circuit boards, and the necessary openings to make interboard connections, will suffice as "spacer means". For example, a heat sink could serve as a spacer means coming within the scope of the invention, if the heat sink is properly shaped to provide the clearances, openings for connectors, etc., as specified hereinabove.

As a further example, an alternate preferred embodiment of the invention contemplates the use of standoffs, instead of spacer boards, to function in the same manner as illustrative boards 104-1 thru 104-8. In particular, if the spacer boards shown in cross section in FIG. 1, like spacer board 104-2, were characterized as a set of standoffs (instead of a board), those skilled in the art can readily appreciate that the above described function of the desired spacer means can be accomplished.

In this case, instead of characterizing the spacer means between exemplary printed circuit boards 103-2 and 103-3 as spacer board 104-2; the spacer means used to separate and support these boards, etc., could be characterized as a set of standoffs (in particular, standoffs 110-1 thru 110-4 as shown in FIG. 1 only to illustrate this alternative embodiment of the invention).

According to an exemplary embodiment of the invention, where the spacer means take the form of standoffs, the standoff devices are preferably made from a non-conductive plastic, although other materials may be used as well.

It should be noted that memory module 100 depicted in FIG. 1 is also shown to include means for coupling electrical signals between an external source (the external source is not shown in FIG. 1) and the at least one memory device referred to hereinabove.

More particularly, such means for coupling electrical signals could include the exemplary means for communicating electrical signals (such as cable 109 depicted in FIG. 1) between the external source and the at least one memory device via a connector means (like connector means 108 shown in FIG. 1) to which exemplary cable 109 is attached and secured via a locking mechanism, like locking tab 110 shown in FIG. 1.

Figure 2:
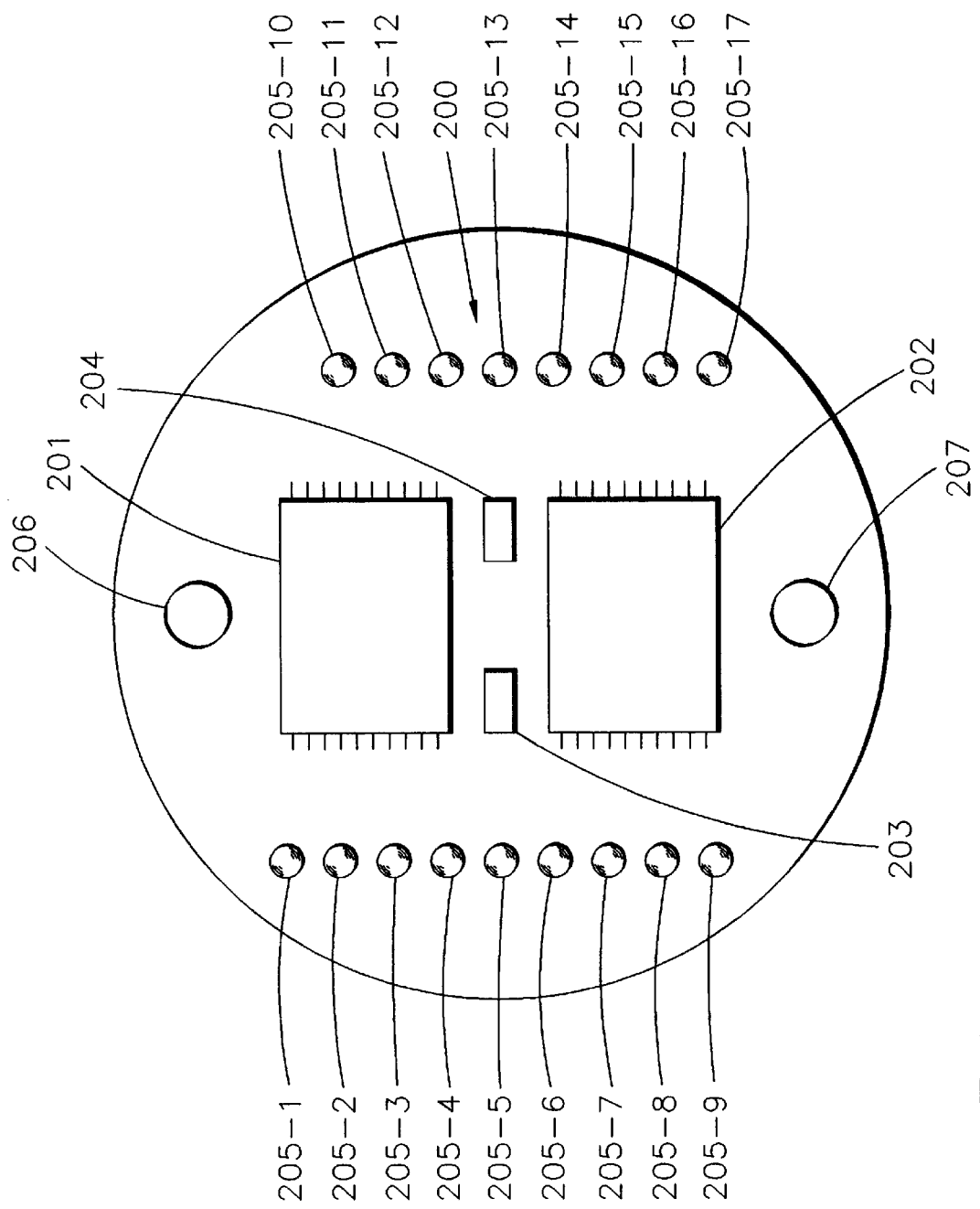
FIG. 2 depicts a top view of an exemplary printed circuit board that may also be used to illustrate the principals of the invention.

Reference should now be made to FIG. 2 which, as indicated hereinabove, depicts a top view of an exemplary printed circuit board that may also be used to illustrate the principals of the invention.

Printed circuit board 200 which could, for example, represent any one of boards 103-1 thru 103-9 shown in FIG. 1 (although not necessarily any of those boards), is shown to be circular is shape (although expressly not a requirement to implement the invention); and include one or more circuits on a surface thereof (the surface being illustrated in the aforementioned top view).

In particular, two illustrative integrated circuit (IC) packages (201 and 202, respectively), are shown together with two capacitors (capacitors 203 and 204, shown only to illustrate typical circuit components that may be located on the surface of a printed circuit board; such components not constituting any part of the invention per se), and conductive pads 205-1 thru 205-17.

One or more of the depicted ICs could, for example, be a solid state memory device; like a non-volatile flash memory chip. According to the invention, component stack 102 must include (in order to constitute part of a "memory module") at least one printed circuit board that has at least one memory device on at least one board surface.

Furthermore, according to the invention, one or more of the aforementioned conductive pads (like conductive pads 205-1 thru 205-17) are incorporated into the electrical circuitry printed on and within the perimeter of each of an adjacent pair of board surfaces. The conductive pads are preferably metallic (for example, copper) and, as indicated hereinbefore, should be formed to easily enable the aforementioned means for interconnecting to be surface mount connected thereto.

What is important to note again about the conductive pads is that, according to the principals of the invention, they do not need to be located on the edges of the printed circuit board (although they could be located any place of the surface of a printed circuit board, including an edge, if desired).

Further reference should be made to FIG. 2 where two holes through circuit board 200 are (at 206 and 207). These openings through the printed circuit board may be used together with other memory module components (to be described hereinafter) to align the conductive pads on the surface of the printed circuit boards in component stack 102; and may also be used to accommodate means used to fasten and secure component stack 102 together before placing the stack in protective memory module housing 101.

The aforementioned "other memory module components" could include, by way of example, alignment rods that are inserted through component stack 102 (through holes like 206 and 207 in printed circuit board 200 and similar holes in other devices in the stack, as needed); nuts or screws to secure the alignment rods in place, etc.

Alignment rod 107, secured by nut 108 (both depicted in FIG. 1) are meant to illustrate exemplary alignment means for registering conductive pads located on adjacent pairs of printed circuit boards; and means for fastening together a stacked plurality of printed circuit boards and spacer means together.

The opposite side of the depicted top view surface of printed circuit board 200 (the board surface that is not shown) may also contain one or more circuits that may be connected to the circuitry depicted in FIG. 2 using through board holes (vias) in a manner well known to those skilled in the art. Since the process for connecting the circuitry on opposite surfaces of a given printed circuit board is well known and does not constitute part of the present invention per se, no further description of that process will be set forth herein.

It is by making the above described connections between a given circuit board surface and an adjacent (facing) stacked printed circuit board surface using (a) at least one conductive pad incorporated into the circuitry printed on and within the perimeter of each of the adjacent pair of board surfaces; and (b) means for interconnecting conductive pads located on and within the perimeter of an adjacent pair of board surfaces; that allows the package volume of the memory module contemplated by the invention to be reduced when compared with the prior art discussed hereinbefore.

According to a preferred embodiment of the invention, the illustrative assembly shown in FIG. 1, is, as indicated hereinabove, placed in a hollow memory module housing (e.g., a metal cylinder), like housing 101 shown in FIG. 1. Memory module housing 101 may then, according to a further aspect of the invention, be placed in (e.g., be wrapped in) a thermal insulator and installed (with the insulation) in a crash housing to facilitate use of the memory module in a flight recorder (it being understood that the invention is not limited to memory modules being used in the flight recorder context).

Reference should now be made to FIG. 3 which, as indicated hereinabove, depicts in the form of a flow diagram an exemplary process for fabricating a memory module of the type contemplated by the invention.

The steps of the illustrative process as shown in FIG. 3 include: (a) forming at least one conductive pad in electrical circuitry printed on and within the perimeter of a first surface of a first printed circuit board, wherein the first printed circuit board includes at least one memory device on at least one surface thereof (step 301 of FIG. 3); (b) forming at least one conductive pad in electrical circuitry printed on and within the perimeter of a first surface of a second printed circuit board, wherein the first surface of the first printed circuit board is intended to face the first surface of the second printed circuit board when the first printed circuit board and the second printed circuit board are placed together in a component stack (step 302 of FIG. 3); (c) stacking the first printed circuit board and the second printed circuit board together in a component stack that includes means for separating and supporting the first printed circuit board and the second printed circuit board and means for interconnecting conductive pads located on and within the perimeter the first surface of the first printed circuit board and the first surface of the second printed circuit board (step 303 of FIG. 3); (d) registering the conductive pads in the component stack (step 304 of FIG. 3); and (e) fastening together the components of the component stack (step 305 of FIG. 3).

According to a preferred embodiment of the invention, the aforementioned process further comprises the step of coating each of the printed circuit boards with a uniform coating of PARYLENE, for anti-corrosion purposes; securing at least one alignment rod secured to and through the stacked plurality of printed circuit boards as separated by the spacer means; protecting and storing the stacked plurality of printed boards and spacer means, secured by the at least one alignment rod, in a memory module housing; and forming at least one via through a given printed circuit board through which to connect conductive pads located on opposite surfaces of the printed circuit board.

Figure 4:
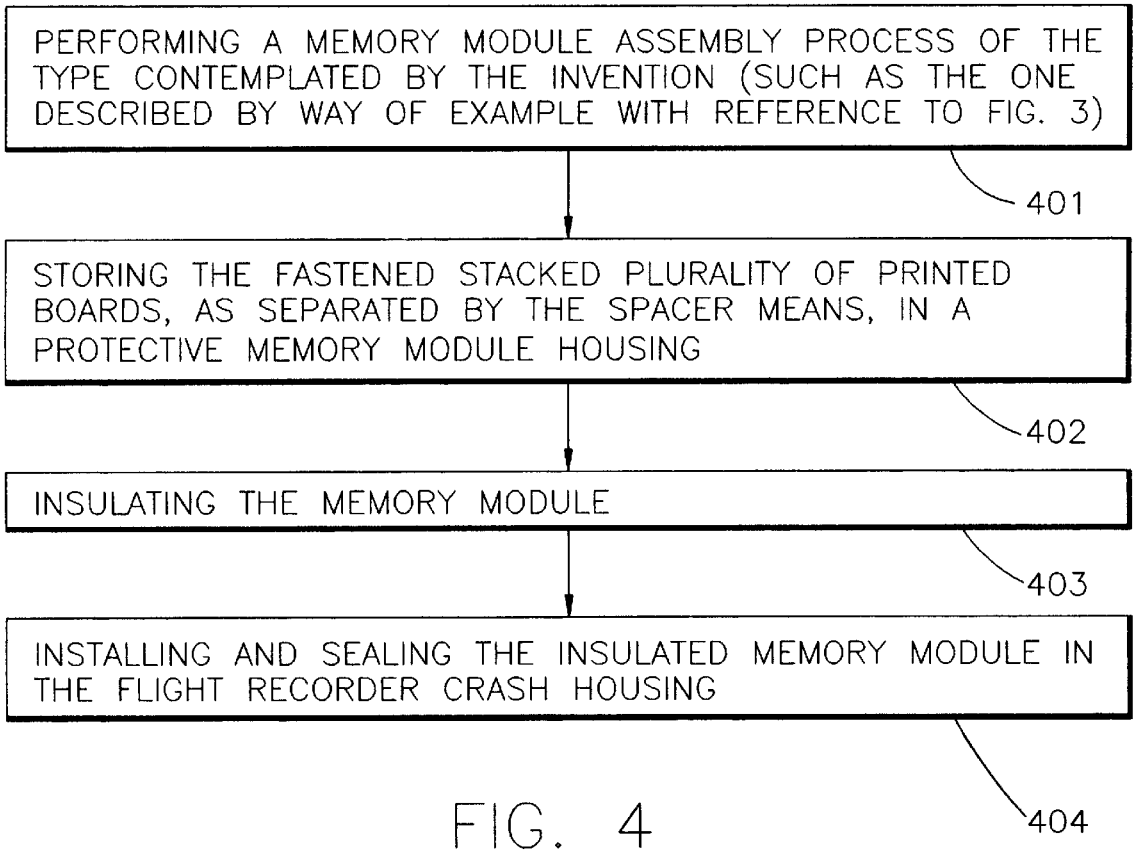
FIG. 4 depicts in the form of a flow diagram an exemplary process for fabricating a flight recorder of the type contemplated by the invention.

Reference should now be made to FIG. 4 which, as indicated hereinabove, depicts in the form of a flow diagram an exemplary process for fabricating a flight recorder of the type contemplated by the invention.

The steps of the illustrative process shown in FIG. 4 include (a) performing a memory module assembly process of the type contemplated by the invention (such as the one described by way of example with reference to FIG. 3), including any desired extra steps not shown in FIG. 3 (but discussed hereinabove), like providing a preferred corrosion resistant coating for the printed circuit boards, etc. (this step (a) is shown as step 401 in FIG. 4); (b) storing the fastened stacked plurality of printed boards, as separated by the spacer means, in a protective memory module housing (shown as step 402 in FIG. 4); (c) insulating the memory module (shown as step 403 in FIG. 4); and (d) installing and sealing the insulated memory module in the flight recorder crash housing (shown at step 404 in FIG. 4).

What has been described in detail hereinabove which meet all of the aforestated objectives. As previously indicated, those skilled in the art will recognize that the foregoing description has been presented for the sake of illustration and description only. It is not intended to be exhaustive or to limit the invention to the precise form disclosed, and obviously many modifications and variations are possible in light of the above teaching.

The embodiments and examples set forth herein were presented in order to best explain the principles of the instant invention and its practical application to thereby enable others skilled in the art to best utilize the instant invention in various embodiments and with various modifications as are suited to the particular use contemplated.

In view of the above it is, therefore, to be understood that the claims appended hereto are intended to cover all such modifications and variations which fall within the true scope and spirit of the invention.

What is claimed is:

1. A flight recorder comprising:
   (a) a crash housing;
   (b) A memory module located within said crash housing including:
      (b1) a stacked plurality of printed circuit boards at least one of which has at least one memory device on at least one board surface;
      (b2) at least one conductive pad incorporated into electrical circuitry printed on and within the perimeter of each of an adjacent pair of board surfaces;
      (b3) means for interconnecting conductive pads located on and within the perimeter of an adjacent pair of board surfaces;
      (b4) spacer means for separating and supporting said stacked plurality of printed circuit boards;
      (b5) alignment means for registering conductive pads located on adjacent pairs of printed circuit boards; and
      (b6) means for fastening together said stacked plurality of printed circuit boards and said spacer means;
   (c) thermal insulation for protecting said memory module from heat, wherein no flammable foam is located between adjacent pairs of printed circuit boards; and
   (d) means for coupling electrical signals between an external source and said at least one memory device, said means for coupling further comprising:

(d1) means for communicating electrical signals between said external source and said at least one memory device via a connector means to which said means for communicating is attached; and (d2) a locking mechanism for securing said means for communicating to said connector means.

2. A method for fabricating a memory module for storing digital information, comprising the steps of:

(a) forming at least one conductive pad in electrical circuitry printed on and within the perimeter of a first surface of a first printed circuit board, wherein said first printed circuit board includes at least one memory device on at least one surface thereof;

(b) forming at least one conductive pad in electrical circuitry printed on and within the perimeter of a first surface of a second printed circuit board, wherein said first surface of said first printed circuit board faces said first surface of said second printed circuit board when said first printed circuit board and said second printed circuit board are placed together in a component stack;

(c) stacking said first printed circuit board and said second printed circuit board together in a component stack that includes means for separating and supporting said first printed circuit board and said second printed circuit board and means for interconnecting conductive pads located on and within the perimeter of said first surface of said first printed circuit board and said first surface of said second printed circuit board;

(d) registering the conductive pads in said component stack;

(e) fastening together the components of said component stack, wherein no flammable foam is located between adjacent pairs of printed circuit boards; and (f) coating the printed circuit boards in said component stack with a uniform coating of PARYLENE.

3. A method for fabricating a memory module for storing digital information, comprising the steps of:

(a) stacking a plurality of printed circuit boards at least one of which has at least one memory device on at least one board surface;

(b) forming at least one conductive pad in electrical circuitry printed on and within the perimeter of each of an adjacent pair of board surfaces;

(c) interconnecting conductive pads located on and within the perimeter of an adjacent pair of board surfaces;

(d) separating and supporting the stacked plurality of printed circuit boards utilizing spacer means;

(e) registering conductive pads located on adjacent pairs of printed circuit boards; and (f) fastening together the stacked plurality of printed circuit boards as separated by said spacer means, wherein no flammable foam is located between adjacent pairs of printed circuit boards; and (g) coating the printed circuit boards in said component stack with a uniform coating of PARYLENE.

* * * * *